United States Patent
Cremer et al.

(10) Patent No.: US 9,812,299 B2
(45) Date of Patent: Nov. 7, 2017

(54) APPARATUS AND METHOD FOR PRETREATING AND COATING BODIES

(75) Inventors: Rainer Cremer, Monschau (DE); Walter May, Aachen (DE)

(73) Assignee: CemeCon AG, Würselen (DE)

( * ) Notice: Subject to any disclaimer, the term of this patent is extended or adjusted under 35 U.S.C. 154(b) by 1538 days.

(21) Appl. No.: 12/989,882

(22) PCT Filed: Apr. 28, 2009

(86) PCT No.: PCT/EP2009/003082
§ 371 (c)(1), (2), (4) Date: Jan. 6, 2011

(87) PCT Pub. No.: WO2009/132822
PCT Pub. Date: Nov. 5, 2009

(65) Prior Publication Data
US 2011/0180389 A1 Jul. 28, 2011

(30) Foreign Application Priority Data
Apr. 28, 2008 (DE) .......................... 10 2008 021 128

(51) Int. Cl.
*C23C 14/14* (2006.01)
*H01J 37/34* (2006.01)
*C23C 14/35* (2006.01)

(52) U.S. Cl.
CPC .......... *H01J 37/3408* (2013.01); *C23C 14/14* (2013.01); *C23C 14/352* (2013.01);
(Continued)

(58) Field of Classification Search
USPC ................................................. 204/192.12
See application file for complete search history.

(56) References Cited

U.S. PATENT DOCUMENTS 3,635,811 A * 1/1972 Lane ........................ 204/192.15
4,098,452 A * 7/1978 Webster et al. ............ 228/123.1
(Continued)

FOREIGN PATENT DOCUMENTS

DE 102006017382 A1 5/2007
DE 102006021994 A1 11/2007
(Continued)

OTHER PUBLICATIONS

Christie, D. J., et al., "Power supply with arc handling for high peak power magnetron sputtering", Journal of Vacuum Science and Technology: Part A, AVS/AIP, Melville, NY, US, vol. 22, No. 4, Jul. 1, 2004 (Jul. 1, 2004), pp. 1415-1419, XP012073747, ISSN: 0734-2101.
(Continued)

*Primary Examiner* — Stefanie S Wittenberg
(74) *Attorney, Agent, or Firm* — Christensen O'Connor Johnson Kindness PLLC

(57) ABSTRACT

The invention relates to an apparatus and a method for pretreating and coating bodies by means of magnetron sputtering. In a vacuum chamber having a metallic chamber wall (26), magnetrons with sputter targets are arranged, at least one of which is an HPPMS magnetron to which electric pulses are fed by connecting a capacitive element (6) with the sputter target of the HPPMS magnetron via a switching element (5). To achieve effective pretreatment and coating of substrates it is provided according to a first aspect to arrange the switching element on the chamber wall. According to a second aspect, an electrode pair is provided, wherein a first electrode is an HPPMS magnetron (1) and the first and second electrodes are arranged in such a manner that a body (11) supported on a substrate table (4) is arranged between the active surfaces of the electrode pair or is moved through the space between the active surfaces of the electrode pair.

(Continued)

In a third aspect, a method is provided, wherein, in an etch step, a negative bias voltage is applied to the body and the body is etched by means of metal ion bombardment, and subsequently the bias voltage is continuously lowered so that material sputtered-off from the sputter targets results in a layer build-up on the body.

14 Claims, 5 Drawing Sheets

(52) U.S. Cl.
CPC ...... *H01J 37/3444* (2013.01); *H01J 37/3467* (2013.01); *H01J 37/3473* (2013.01)

(56) References Cited

U.S. PATENT DOCUMENTS

| | | | | |
|---|---|---|---|---|
| 5,096,562 | A | * | 3/1992 | Boozenny et al. ...... 204/298.22 |
| 6,136,095 | A | * | 10/2000 | Xu et al. .................. 118/719 |
| 6,296,742 | B1 | | 10/2001 | Kouznetsov |
| 6,352,627 | B2 | | 3/2002 | Leyendecker et al. |
| 2001/0009225 | A1 | * | 7/2001 | Leyendecker et al. .. 204/298.08 |
| 2002/0046944 | A1 | * | 4/2002 | Geva ...................... 204/298.08 |
| 2004/0173305 | A1 | * | 9/2004 | Sato et al. ............... 156/244.17 |
| 2006/0260938 | A1 | * | 11/2006 | Petrach .................... 204/298.16 |
| 2007/0188104 | A1 | | 8/2007 | Chistyakov |
| 2007/0256927 | A1 | | 11/2007 | Vetter |
| 2009/0068450 | A1 | | 3/2009 | Muenz et al. |
| 2009/0200158 | A1 | | 8/2009 | Ehiasarian |

FOREIGN PATENT DOCUMENTS

| | | | | |
|---|---|---|---|---|
| JP | 2006-161088 | * | 6/2006 | ............. C23C 14/34 |
| WO | WO02103078 A1 | | 12/2002 | |
| WO | WO2004094686 | * | 11/2004 | ............. H01J 37/34 |
| WO | 2006049566 A | | 5/2006 | |

OTHER PUBLICATIONS

International Search Report of corresponding PCT Application No. PCT/EP2009/132822 as completed by the ISA/EP dated Nov. 20, 2009 (total 12 pgs.).

Christie, D. J., "Target material pathways model for high power pulsed magnetron sputtering", J. Vac. Sci. Tech. A, 23(2) (2005) pp. 330-335 (total 6 pgs.).

* cited by examiner

APPARATUS AND METHOD FOR PRETREATING AND COATING BODIES

CROSS-REFERENCE TO RELATED APPLICATIONS

This application is a 371 filing of PCT Application No. PCT/EP2009/003082 filed Apr. 28, 2009, which claims priority to German Patent Application Number 10 2008 021 128.1 filed Apr. 28, 2008, the specifications of which are hereby incorporated by reference in their entirety.

The invention relates to an apparatus and a method for pretreating and coating bodies by means of magnetron sputtering.

It is known to provide bodies or parts of bodies with a surface coating to improve their mechanical properties. In particular, plasma-based PVD methods, such as arc evaporation and magnetron sputtering have proven useful, wherein the coating material is removed from so-called targets by means of plasma action and is subsequently deposited on the substrates.

A magnetron includes, as well as a target, cooling means, electrical shielding means, as the case may be, and, in particular, means for generating magnetic fields which increase the plasma density in front of the target. During operation of the magnetron, the target is connected as a cathode with respect to the chamber side walls and/or with respect to the shielding of the magnetron, or with respect to a separate electrode, acting as an anode.

Compared with arc evaporation, magnetron sputtering is advantageous since the liquid phase is avoided. In this way, a nearly unlimited range of layered alloys is possible and the layers are free of growth faults, so-called droplets.

However, the degree of ionization of the coating particles is no more than a few percent with conventional magnetron sputtering. The ionization is greatest in front of the target and hardly extends into the coating chamber. This can be marginally improved by means of asymmetrical magnetic fields behind the magnetron, a so-called unbalanced magnetron (UBM), it is, however, not sufficient especially with large coating volumes, as they are common in commercial plants. Furthermore, the ionization consists predominantly of ions of the working gas and only a very small percentage of ionized material of the target.

Metal ions have the advantage, amongst others, that they can be selected in such a manner that they form part of the coating material and do not contaminate the layer. Furthermore, they have less ionizing energy than the usual process gases.

A variant of this method in which this drawback is avoided is the so-called "High Power Pulsed Magnetron Sputtering" (or shortly HPPMS). Herein, short, but highly energetic, pulses of the electric plasma generators are used to achieve a high ionization density of the coating particles in front of the magnetron, reaching almost 100%. In a pulse having sufficient energy, the current is increased at such a rate that the plasma states of glow discharge and high current arc discharge (arc) are so rapidly passed through that a stable plasma with a very high charge carrier density can be formed in front of the magnetron. The power maximally injected during a pulse can be in the megawatt range and the power injected per $cm^2$ target surface can reach the kilowatt range so that the pulse duration must be chosen to be correspondingly short to avoid damaging the magnetron.

HPPMS has numerous advantages. By means of electric and magnetic fields, both the energy and the direction or trajectory of the ionized coating particles, usually ions, can be determined. Due to the negative potential (bias) usually applied to the substrate with magnetron sputtering, cavities, or surfaces of the substrate not lying in the line of sight, are also reached. The bias also determines the energy of the ions on which various layer properties depend. On the side of the magnetron, substantially better utilization of the coating material, or the target, is achieved by the powerful ion bombardment. Furthermore, the so-called target poisoning, due to reaction with reactive gases, is avoided. In conventional magnetron sputtering of metal targets in reactive gas, isolating reactive layers are formed on the magnetron which prevent effective vaporization of the metal and can result in isolating layers and charges and arcs. If this is prevented by lowering the reactive gas pressure, however, the metal content in the layers is too high and their hardness is reduced. However, hard material layers, in particular, usually consist of compounds having a fixed stoichiometric ratio of metals and non-metals. A trade-off between layering rate and reactive gas flow must always be achieved, which must be precisely adhered to during the process. In HPPMS, with a high percentage of ions of the target, in particular of metal ions, part of the metal ions is accelerated back onto the target, however, and target poisoning is prevented. The precise working point is thus less critical, and coating can be carried out in reactive processes at a layering rate similar to that of conventional sputtering.

With purely metallic layers, where there is no problem of target poisoning, the layering rate in HPPMS can fall short, however, of that of conventional magnetron sputtering.

The high ionization not only affects the present sputter and reactive gases, but also the ions of the target, preferably the metal target, chipped off from the HPPMS target. The HPPMS process can also be carried out at very low pressures, so that the HPPMS electrode can almost exclusively serve as a source of metal ions. The metal ions can be used for coating, but also for pretreating the substrates, which is also referred to as etching. The pretreatment consists of the sputtering away of contamination or the implantation of metal ions into the substrate. To achieve this, a higher biasing voltage is applied to the substrate.

The basics of HPPMS can be found with Kouznetsov, in particular in PCT application WO 98/040532. The realization of special power supplies can be found in U.S. Pat. No. 6,296,742. EP 1 609 882 discloses various approaches to direct the ions onto the substrate after the pulse. D. J. Christie, in "Target material pathways model for high power pulsed magnetron sputtering", J. Vac. Sci. Tech. A, 23(2) (2005) 330, explains the effects leading to a rate loss in HPPMS.

It is therefore the object of the present invention to describe a method and an apparatus enabling effective pretreatment and coating of substrates.

This object is achieved by an apparatus and a method. Dependent claims relate to advantageous embodiments of the invention. Herein, the suggested improvements of well-known methods are associated with the individual above-mentioned aspects, they can be, however, combined in any desired fashion between the aspects.

Basically any desired bodies can be pretreated and any desired layers can be de-posited with the apparatuses and the method according to the present invention. Preferred are durable and/or hard protective layers on parts and tools, in particular on tools for machining. As will be explained in more detail in the following, in particular with reference to the preferred exemplary embodiments, it is preferred, in particular, to deposit hard material layers with or without intermediate, transition and adhesive layers on the substrates. Hard material layers are understood to be layers, such as Ti—Al—N, $Al_2O_3$ or layers having comparable hardness.

The apparatus suggested according to the present invention is provided for pretreating and coating bodies by means of magnetron sputtering. It comprises a vacuum chamber having metallic chamber walls. Magnetrons with sputter targets, preferably metal targets, are arranged in the vacuum chamber.

At least one of the magnetrons is configured as an HPPMS magnetron, i.e. it can be operated according to the high power pulsed magnetron sputtering process. For this purpose, it is connected to an HPPMS power supply.

Optionally, in addition, conventional magnetrons can also be provided in the vacuum chamber. Conventional magnetrons are to be understood as those types that are not HPPMS magnetrons. Various types are known according to the state of the art. They can be, for example, DC operated, high frequency operated, middle frequency range operated, unipolar or bipolar pulsed magnetrons. If they are bipolar pulsed magnetrons, the pulse frequency is preferably at 1-500 kHz, further preferably at 2-200 kHz, particularly preferably at 4-100 kHz.

The magnetron is referred to as an HPPMS magnetron if it can be operated in the HPPMS mode, i.e. is connected to a suitable HPPMS power supply. HPPMS is understood to mean that the ionization state described by Kouznetsov in WO 98/040532 is reached, which can be identified from the voltage and current density.

Furthermore, a low ratio of less than 0.1 between pulse duration and pulse pause is characteristic for the HPPMS operation, i.e. the pulse pause is more than 10 times as long as the pulse duration. Typical pulse durations are 100 µs, for example.

An additional, optional criterion for HPPMS operation can be that the power density is relatively uniformly distributed over the target.

The literature often mentions power densities in the pulse of more than 1000 $W/cm^2$ (calculated as the electric power of a target divided by the target surface) on the target in HPPMS. In tests it has been shown, however, that such power densities are often not achievable, in particular if insulating layers, such as aluminum oxide, are applied. The particular advantages of the HPPMS operation already appear, however, at low power densities. The advantages have thus already been apparent at power densities of as little as 600 $W/cm^2$, but also of as little as 300 $W/cm^2$.

All magnetrons are preferably operated with three magnetic poles behind the target. The central pole preferably has a stronger field than the outer poles. Such magnetrons are also referred to as unbalanced magnetrons (UBM).

The HPPMS magnetron provided according to the present invention can be a conventional type of magnetron as far as the construction of the magnetron itself is concerned. It cannot be excluded, however, that the magnetrons operated with HPPMS are particularly adapted to this mode using constructive means.

In the apparatus, electric pulses are applied to the HPPMS magnetron by connecting a capacitive element by means of a switching element with the sputter target of the HPPMS magnetron. According to the present invention, the switching element is arranged on the chamber walls.

According to the invention, it is intended to mount the switching elements for the HPPMS pulse as close as possible to the associated HPPMS electrodes. While the currents for charging the HPPMS capacitors are moderate, extremely high and short power pulses occur as the capacitive element is discharged, with correspondingly intense and broadband interference. According to the present invention, the switching element is mounted directly on the outside of the chamber wall, preferably in the vicinity of the vacuum passage used for connection to the magnetron.

Due to the extremely high pulse energies in HPPMS, high electric and electromagnetic interference occurs, which can considerably interfere with the complex regulating circuits in modern industrial plants. The problems are exacerbated with multi-cathode systems and great distances between the electrodes as in the subsequently described modes of operation. When insulating layers are deposited, the problems worsen, since in this case, a plurality of electrodes are often operated in the pulsed mode. Charges and the occurrence of arc discharges on the one hand cause increased electromagnetic interference, while on the other hand they cause increased overhead for regulating circuits. In particular, electronic circuits for the rapid detection and suppression of arcing are referred to here.

By means of the arrangement of the switching element, the line lengths of the switched current, in particular line lengths outside of the chamber, are substantially reduced. It has emerged that substantially lower electromagnetic interference occurs with the arrangement according to the present invention.

The essential elements of the HPPMS supply provided, are the capacitive element that is preferably continuously recharged in the pulse pauses, and a switching element that discharges the charged capacitive element to generate a pulse. The duration and sequence of the pulse timing can be determined by a control apparatus. The switching element could in principle be a mechanical switch, it is preferably configured, however, of IGBT (Insulated Gate Bipolar Transistor) power semiconductors.

The capacitive element must provide high voltages and currents. According to a preferred embodiment of the invention, individual capacitors that are high voltage proof (preferably to more than 1000 V, particularly preferably voltage proof to 2000 V or more) are electrically connected in parallel with a close packing density to form a capacitor bank. Preferably, the capacitor bank comprises more than five, particularly preferably more than ten capacitors connected in parallel. The overall capacity of the capacitor bank is preferably 20-100 µF, further preferably more than 30 µF, particularly preferably more than 40 µF.

A switching element and/or a capacitor bank can also form a unit together with the vacuum passage. This unit can be arranged in a common housing, for example.

Furthermore, cooling means that are already provided at the passages or the chamber wall can also be used for the switching elements. Similar measures are also advantageous for the switching elements in the dual magnetron mode.

In a preferred embodiment with an electrode pair, the electrodes of which are arranged at a relatively great distance, the risk of electromagnetic interference is increased due to the correspondingly long leads. In a preferred embodiment, the leads are thus installed within the metallic coating chamber thus reducing electromagnetic interference in the ambient space. In a further preferred embodiment, the leads of the counter electrode or anode are passed into the chamber through the same vacuum passage as the leads for the electrode itself.

The development of the invention is based on the idea that while high ion densities are achieved in front of the magnetrons with well-known apparatuses and method, these ion densities, however, are not continuously useful within the coating volume, i.e., at the location of the substrates to be coated. This applies, in particular, for HPPMS and for commercial plants with large coating volumes and greater distances between substrates and magnetrons. The invention enables pretreatment and coating of substrates by means of magnetron sputtering, wherein both a high metal ion density and a high gas ion density can be achieved within the entire coating volume. By preferably providing both conventional, such as DC magnetrons, on the one hand, and HPPMS magnetrons on the other, in the vacuum chamber, it is possible to predetermine the amount of metal ions on the one hand and of gas ions on the other by suitably selecting the electric power of the respective magnetrons.

The high ion density is achieved by a particular connection of the electrodes. At least one plasma-producing electrode pair is arranged in the vacuum chamber. The electrode pair comprises, as a first electrode, an HPPMS magnetron. The second electrode, as will be explained in the following, can be a second HPPMS magnetron, a conventional magnetron, or an anode.

According to the present invention, the first and second electrodes are arranged in such a manner that a body supported on a substrate table is arranged between the active surfaces of the electrode pair or is moved through the space between the active surfaces of the electrode pair.

Therefore, the first and second electrodes are preferably arranged in such a manner that line-of-sight connection lines of the operative electrode surfaces at least partially and temporarily cross the substrates to be treated. This usually also means that the electric field lines between two associated electrodes of an electrode pair at least partially and temporarily cross the substrates and the substrate surfaces are treated with charge carriers, in particular metal ions and gas ions. This is achieved in the simplest case by inserting the substrates between the electrode pair, or by passing them through the space between the electrode pair.

Herein, the magnetrons can be operated as normal magnetrons or as HPPMS magnetrons.

An electrode pair in the present specification consists of two electrodes and an electric power supply, wherein the electrodes are connected with each other by the electric power supply. The connection need not necessarily be direct. It can be achieved via interference suppression or adaptive networks, switching elements or other electric elements. It is crucial that the electric energy that is passed to the electrodes is primarily supplied by the associated power supply. An electrode can also be part of a plurality of electrode pairs. A magnetron electrode pair is one where at least one electrode is a magnetron electrode.

An electrode of an electrode pair is referred to as an anode if it is primarily at a positive potential with respect to the second electrode. Conversely, an electrode of an electrode pair is referred to as a cathode if it is primarily at a negative potential with respect to the second electrode.

An electrode pair where two magnetrons are used as electrodes that have alternating polarities with respect to each other (bipolar) so that the electrodes alternate between being an anode and a cathode, is also referred to as a dual magnetron, and the corresponding mode of operation is referred to as the dual magnetron mode.

The chamber preferably has the usual apparatuses of a sputter plant, such as controlled gas inlets for working and reactive gases and a vacuum pump gas outlet. A substrate table is preferably in the center of the plant. The electrodes, in particular the magnetrons, are preferably in the vicinity of the walls and are arranged about the substrate table, preferably in a uniform arrangement. Herein, the targets face in the direction toward the substrate. The table is preferably rotatable so that the substrate or the substrates can be moved past the magnetrons. Further axes of rotation can also be provided at the rotating table so that a plurality of substrates can be coated from all sides in a planetary rotation. The space in which the substrates are pretreated and coated is also referred to as a coating volume, and the entirety of all substrates together with the associated supports is referred to as a batch. With at least one magnetron electrode pair, at least one line of sight between the active electrode surfaces crosses the substrate(s) at least partially and temporarily.

Due to this comparatively great distance, high ionization is created in the entire chamber since electrodes move from the cathode to the anode and cause additional ionization along their entire path. If the chamber is filled with a working and/or reactive gas, high gas ionization is achieved in this manner.

The HPPMS magnetron implemented according to the present invention primarily achieves high metal ion density. It has been found that the ionization is increased and further extended in the coating volume if an anode is provided that is maintained at a predetermined positive potential with respect to the chamber wall. For this purpose, a preferably voltage-regulated electric power supply is preferably connected between the anode and the chamber wall.

According to a development of the invention a particular type of transition between etching and coating can be provided.

During coating as well as in the pretreatment of substrates, a negative potential is usually applied to the substrates. This potential is often also referred to as a bias potential and attracts ions to the substrate surface. This results, amongst other things, in a compaction of the layers during coating and in a reduction of tensile stresses and thus enhances the layer quality and layer adhesion. Etching is defined as the removal of contamination or of parts of the substrate. In contrast to coating, it is used to remove material. During ion etching, the bias potential is usually at a strong negative potential. By means of this intense bombardment, the substrate surfaces are cleaned and activated. If the bombardment is with metal ions in the HPPMS mode and at high bias voltages, the metal ions can also be implanted near the surface. This improves the subsequent deposition of the layers. By varying the bias voltage, a continuous transition can be achieved between etching and coating and thus between substrate and layer.

By freely choosing the metal targets, preferably the HPPMS metal targets, the transition between substrate and layer can be variously configured. Since etching and coating can be carried out with the same metals, a graduated interface and excellent adhesion can be achieved by first applying a high negative bias voltage of, for example, 1000 V on the substrate in an etch step and then continuously reducing this bias voltage.

In a preferred embodiment of the method according to the present invention, first metal atoms are implanted in the substrates by accelerating metal ions onto the substrate at a high negative substrate bias of, for example, −1200 V while the HPPMS targets are running. Then, a thin metallic intermediate layer is created of the same material by reducing the bias voltage. Subsequently, a hard material intermediate layer, also thin, can be deposited while utilizing the same metal by adding a reactive gas. Finally, the actual hard material layer is deposited. Three cases can be distinguished: first, the metals of the intermediate layers differ from the metals of the hard material layers; at least one metal of the intermediate layers can also be found in the hard material layers, and third, the metals in the intermediate layers and hard material layers are essentially identical. In the multitudinous cases of application of hard material layers, the most advantageous constellation can be determined in each case by trial and error. However, the metals Ti and Cr have proven particularly useful as elements for the intermediate layers.

Preferably, the intermediate layer and the hard material intermediate layer have each a thickness of 1-200 nm, particularly preferably of 10-100 nm.

By suitably adjusting the gas ion and metal ion densities, optimized transitions can additionally be created in the interface area. Herein, it is particularly advantageous that, during HPPMS etching, a sufficient bombardment with gas ions also takes place at the same time. Furthermore, it has been shown that pure gas etching prior to HPPMS further improves adhesion.

The bias voltage can be applied between the substrate table and the chamber. It is preferred, however, to apply a bias supply between the substrate table and the anode. Preferably, a chamber only has one anode potential, which is the most positive potential of all electrodes needed for the substrate treatment and coating. However, a plurality of spatially separated anodes can be connected with each other and thus have this potential applied to them.

The preferred adjustability of gas ion and metal ion density further enables the optimization of numerous properties, such as layer quality, layering rate, layer composition, layer structure and layer tension. Also a great number of variations are possible with multiple layers.

In a preferred variant, the HPPMS magnetrons are connected against a remote anode. If a substrate crosses the line of sight between the HPPMS target and the associated counter electrode, a high metal ion density and gas ion density is achieved in the substrate vicinity. The electrons create gas ionization on their path to the counter electrode; furthermore, sputtered or recombined metal ions are also newly ionized, or singly ionized metal ions are multiply ionized.

Surprisingly, this method has proven useful in coating insulating layers, preferably oxidic, particularly preferably aluminum oxide layers. The processes are more stable since charges and arcs are less frequent. However, the same also applies if a conventional magnetron pair is operated in the dual magnetron mode, while at the same time also operating HPPMS magnetrons. The layering rate in these cases is even higher than when only conventional magnetrons are used.

Embodiments of the invention will be further described in the following with reference to the drawings, wherein:

FIG. 1 is a principle diagram of a horizontal cross section of a first embodiment of a coating apparatus having two HPPMS and two conventional magnetrons, FIG. 2 is a principle diagram of the connection of a power supply of the coating apparatus according to FIG. 1, FIG. 3 is a principle diagram of a horizontal cross section of a second embodiment of a coating apparatus having four HPPMS magnetrons, FIG. 4 is a principle diagram of the connection of a power supply of the coating apparatus according to FIG. 3, FIG. 5 is a principle diagram of a horizontal cross section of a third embodiment of a coating apparatus having two HPPMS and two conventional magnetrons working in the dual magnetron mode, FIG. 6 is a principle diagram of a horizontal cross section of a fourth embodiment of a coating apparatus having two HPPMS magnetrons and two conventional magnetrons, wherein all magnetrons are connected against a common anode, FIG. 7 is a principle diagram of a horizontal cross section of a fifth embodiment of a coating apparatus having four HPPMS magnetrons connected against a common anode, FIG. 8 is a principle diagram of a horizontal cross section of a sixth embodiment of a coating apparatus with connections, by means of which two HPPMS magnetrons are pulsed against each other in a bipolar manner, FIG. 9 is a circuit diagram of a switching element for driving an HPPMS magnetron, and FIG. 10 is a principle diagram of a vertical cross section of a chamber wall and an HPPMS power supply mounted on it.

FIGS. 1-8 each show a coating chamber of a PVD sputtering apparatus having four magnetrons and a rotatable substrate table 4. The magnetrons comprise a hatched rear area with shielding means, cooling apparatuses and magnet systems and—non-hatched—a respective target, of the material to be sputtered. In the examples shown, the targets are formed as a rectangular plate in each case, the front of which faces substrate table 4.

In the embodiments shown, at least one of the magnetrons is formed as an HPPMS magnetron in each case, and is identified by the designation "H" on the target in the figures. The designation "HPPMS magnetron" primarily relates to the manner of connection, i.e. HPPMS magnetrons are connected to an HPPMS power supply while conventional UBM magnetrons are connected to a conventional DC power supply, or alternatively, to a conventional pulsed power supply with voltage pulses of conventional energy. The magnetrons themselves, in the examples shown, are identical in their structure, i.e. shape and size of the targets, magnet system, cooling etc. Alternatively, it would also be possible to adapt the magnetron apparatuses as HPPMS or conventional UBM magnetron according to each application, for example in the strength or form of the magnetic field, the dimensioning of the cooling etc.

The targets of the HPPMS magnetrons are each operated with a separate HPPMS power supply. The shielding of the target and/or the chamber wall, held at the same potential, or a remote anode, function as the anode, as indicated for each of the individual embodiments. The targets of the HPPMS magnetrons produce metal ions in sputtering operation, which are provided for the pretreatment and coating of the substrates moved past by the substrate table. The remote anode is preferably held at a positive potential $V_C$ with respect to the chamber wall by means of a power supply during coating.

In a first exemplary embodiment (FIG. 1) two HPPMS magnetrons 1 and two conventional UBM magnetrons 2 are present in the vicinity of the chamber walls in a metallic coating chamber having a volume of about 0.7 m$^3$. Between them, there is a rotating substrate table 4. The substrate table 4 comprises rotating plates 3 on which substrates 11 are fixed on racks and are connected in an electrically conductive manner. The substrates are bodies to be coated whose shape corresponds to each application purpose, for example as machining tools. The substrates are moved past the magnetrons on the rotary plates in a planetary rotation at varying distances. A substrate bias voltage $V_B$ with respect to anode 3 is applied to substrate table 4 conductively connected with the substrates.

Conventional magnetrons 2 are operated with respect to an anode 3 during coating, which is present on the opposite side of substrate table 4. For this purpose, individual power supply units associated with magnetrons 2 generate voltages $V_{M1}$ and $V_{M2}$, with the aid of which magnetrons 2 are brought to a negative electric potential as cathodes with respect to anode 3. Due to the great distance between magnetrons 2 and anode 3, the electrodes created on cathodes 2 and in space, travel a great distance through the chamber and create further ionization. This is how a high gas ion density is provided in the entire coating volume on substrates 11.

The targets of the two HPPMS magnetrons 1 primarily furnish metal ions at the same time. In the present example, they are driven against earthed shielding means of the magnetrons, which, in the present case, serve as the anode, during pretreatment and coating. Due to the increased metal ion content due to the operation of the HPPMS magnetrons 1 as compared to the operation of purely conventional magnetrons, the result is a substantially improved layer quality and adhesion.

FIG. 2 is a symbolic schematic diagram of an HPPMS power supply 14 of the coating apparatus, wherein the HPPMS power supply 14 is only shown in an exemplary manner for HPPMS magnetron 1 at the bottom left, and the other HPPMS magnetron has a further, identical HPPMS power supply (not shown) associated with it. HPPMS power supply 14 comprises a switching element 5, a capacitive element 6 and a DC power supply unit 7.

FIG. 9 shows a schematic diagram of switching element 5. It comprises a power transistor 16 configured as an IGBT and is arranged in series between capacitive element 6 and HPPMS magnetron 1. IGBT 16 is driven by a control unit 20. Control unit 20 further includes a drive interface 24 by which the state of the switching element is determined. An external control computer determining the duration and the timing of the pulses controls the control unit 20 in a suitable manner.

Capacitive element 6 is provided as a capacitor bank, i.e. a parallel connection of individual capacitors. In a preferred example, individual capacitors are used each being voltage-proof up to 2000 V. In the preferred embodiment, as many of these individual capacitors are connected in parallel as are needed to achieve a suitable overall capacity of capacitor bank 6 of, for example, 30 µF or 50 µF.

As shown in FIG. 2 in an initial symbolic representation, switching element 5 and capacitor bank 6 are in the immediate vicinity of the cathodes on an associated electrovacuum passage 8 on the outside of the chamber wall. Cooling of the switching elements can be carried out by the cooling circuits of the chamber wall, air cooling also is possible as an alternative.

The DC power supply 7, which charges the capacitors of the capacitor bank 6 in the pulse pauses, only has low power requirements compared to the pulse power requirements and resides in a remote switch cabinet.

In FIG. 10 the arrangement of capacitor bank 6 and switching element 5 on chamber wall 26 is shown in a principle diagram. These are arranged in a housing 28 that is directly mounted on chamber wall 26.

Water cooling is provided for HPPMS magnetron 1 arranged in the chamber, comprising a cooling medium inlet 30a and a cooling medium outlet 30b. The cooling medium supply is initially fed to housing 28 through hoses. The subsequent feeding-in and draining of the cooling medium to HPPMS magnetron 1 is through copper tubes 36, 38 extending through a vacuum insulation 32 of chamber wall 26.

Copper tubes 36, 38 are also used as electric conductors to conduct the HPPMS current pulses from switching element 5 to magnetron 1. For this purpose, the electric output of switching element 5 is electrically connected with the two tubes 36, 38 by means of a sleeve clamp 34. Insulating element 32 provides electric isolation with respect to chamber wall 26.

The result is on the one hand an extremely simple structure at passage 8. On the other hand, tubes 36, 38 can be excellently used as conductors with a relatively large cross section for conducting the very high currents. Since the tubes 36, 38 themselves conduct the cooling medium, cooling of the electric conductors is provided without additional overhead.

Capacitor bank 6 and switching element 5 are thus arranged directly adjacent to each other, i.e. at a distance of less than 80 cm from each other, preferably even less than 20 cm from each other, to keep the conductor distances through which the current pulses are conducted as short as possible. Capacitor bank 6 and switching element 5 are also mounted in the vicinity of HPPMS magnetron 1 that is arranged on the other side of chamber wall 26 so that, again, the current paths are kept short, preferably less than 50 cm from switching element 5 to HPPMS magnetron 1, particularly preferably less than 30 cm.

Furthermore, the arrangement is configured in such a manner that only a minimum length of conductor through which the current of an HPPMS pulse is conducted, is arranged outside of the vacuum chamber. The metallic vacuum chamber acts as a Faraday cage so that electromagnetic interference outside of the plant is minimized and high operating safety is achieved.

In an exemplary configuration of the coating apparatus according to the first embodiment, all targets, except for a first HPPMS target that only consists of titanium, consist of titanium plates in which aluminum inserts (Ti—Al target) are integrated.

The operation of the coating apparatus according to the first embodiment will be described in the following in an exemplary manner for pretreating and coating bodies (substrates) 11, such as machining tools, arranged on substrate table 4.

The substrates are first heated to approximately 500° C. In a first etch step, argon gas is introduced into the chamber and the two conventional magnetrons 2 are commonly operated as an anode against electrode 3 each at a distance of about 45 cm, acting as a cathode during etching. Herein the substrates are maintained at a negative potential. The high gas ion density thus created in the substrate vicinity results in initial cleaning and activation of the substrate surface in a first etch step.

In a second step, with the operation otherwise the same as in the first etch step, the first HPPMS magnetron 1 is additionally operated, the target of which is only titanium, at a low argon pressure. By suitably adjusting the voltages $V_B$ and $V_C$ a new, higher negative potential of −1100 V is applied to the substrates with respect to the chamber wall. The metal ions clean and etch the substrate surface. A small proportion of the ions is implanted near the surface. Since the argon pressure is still present as before, bombardment with argon ions occurs at the same time.

Within a transition period of several minutes, 5 minutes according to one example, the substrate bias is continuously reduced from −1100 V to −100 V. This results in a thin interface of Ti.

Subsequently, nitrogen is introduced for a few minutes. A thin hard material layer of TiN is formed. Subsequently, the argon and reactive gas flows are increased and the second HPPMS magnetron (with a Ti—Al target) is additionally operated. Furthermore, the conventional magnetrons 2 are now operated in DC operation as cathode against electrode 3, now acting as an anode.

The three additional magnetrons release Al and Ti atoms as well as Al and Ti ions. By adjusting the power of the individual magnetrons, the stoichiometry of the hard material layer can be adjusted.

The electrons produced in front of magnetrons 2 move towards anode 3 in the electrical field and create further charge carriers in the substrate vicinity in this way. The electric field is symbolically indicated by a broken line in FIG. 1 and the following drawing figures. This line approximately corresponds to the electric field line impinging on the middle of the two electrodes of an electrode pair. The other electrodes in the chamber can lead to distortions of the field lines.

In particular due to the rotating substrates, considerable deviations can occur temporarily. However, taken as a temporal mean, the field line has approximately the trajectory shown. The lines of sight between the active electrode surfaces only deviate little from the field lines over greater distances. The substrates rotating past intersect these lines of sight at least partially and temporarily. The thus created gas ions are thus available on the substrates with high concentrations. The ions are accelerated towards the substrates by the substrate bias voltage $V_B$ during coating. The ions of the sputter gas thereby compact the layers while the ions of the reactive gas can react with the sputtered metal ions and atoms to result in the desired coating material TiAlN. The metal atoms originate primarily from the conventional UBM magnetrons, while the metal ions come mainly from the HPPMS magnetrons. This combination results in particularly hard and adhering layers at a good layering rate.

If, on the other hand, layers are produced with the same experimental set-up but using only conventional UBM magnetrons, the result is layers having a lower hardness and adhesion in comparison, as well as a higher roughness.

The treatment of flat steel of X38CrMoV51 hardened to 1400 MPa, enabled the tool life of mills with a radius of 10 mm to be increased by 21%.

In a comparative example, HPPMS magnetrons were used as well as UBM magnetrons, but all magnetrons were operated against the earthed shielding. In the comparative example, while there was in part also improved adhesion and hardness compared to a coating achieved only by means of conventional UBM magnetrons, however, the layer properties were not homogeneous on the entire substrate.

In a second embodiment according to FIG. 3, otherwise identical to the first embodiment, four HPPMS magnetrons are provided. Two of the HPPMS magnetrons are operated against a remote anode so that, again, the electrodes travel a great distance and also cause high gas ionization in the entire coating volume.

FIG. 4 shows, in an exemplary manner for the second embodiment and with reference to FIG. 3, the connection of an HPPMS magnetron and the associated counter electrode. The electric feed line 9 for anode 3 on the other side of the substrate table extends in the interior of the vacuum chamber along the chamber walls behind shielding sheets (not shown). Due to this arrangement, electromagnetic interference outside of the coating apparatus is minimized and high operating safety is achieved.

During coating of substrates with the arrangement according to the second embodiment, with otherwise the same structure and process sequence, layers with even greater hardness, but with high pressure tensions were produced. Such layers are particularly advantageous for hard machining and are preferably only applied with small layer thicknesses. In comparison to the application example of the first embodiment, tool life was further extended by 16%, i.e. an improvement of 37% overall against conventional coatings.

FIG. 5 shows a third embodiment of a coating apparatus that can preferably be used for pretreatment of substrates and/or for coating of substrates with non-conducting layers, for example oxide layers, such as aluminum oxide. The coating apparatus that is identical to the above-mentioned embodiments except for the details of connection discussed here, comprises two HPPMS magnetrons and two conventional magnetrons. One of the HPPMS magnetrons is equipped with a target of chromium and is only used for pretreatment and for the application of intermediate layers; the targets of the other magnetrons consist of aluminum. The two conventional UBM magnetrons are operated for coating in the dual magnetron mode.

The operation of the coating apparatus according to the third embodiment will be described in the following in an exemplary manner for creating oxide layers:

First, an etch treatment analogous to the exemplary operation of the first embodiment is carried out, wherein, however, an HPPMS chromium target is used instead of an HPPMS titanium target. As in the first example, a hard material intermediate layer is created by first depositing a metal layer of the target material and then introducing a reactive gas. In the exemplary operation of the third embodiment, a CrN hard material intermediate layer is created by first depositing a Cr layer and then introducing nitrogen as a reactive gas.

In the further coating operation the nitrogen reactive gas is replaced by oxygen so that first a very thin Cr—N—O transition layer is formed and then a $Cr_2O_3$ hard material intermediate layer.

While subsequently the power of the Cr magnetron is reduced, ramped-up electrical power is supplied to the Al HPPMS magnetron and the two conventional Al magnetrons to create the actual $Al_2O_3$ hard material layer.

At this the Al HPPMS magnetron is operated against the chamber wall. The two conventional magnetrons are operated at a distance of 45 cm and at 50 kHz in the dual magnetron mode.

Due to the use of an HPPMS magnetron together with the two conventional magnetrons equipped with Al targets, a high layer quality is achieved. Furthermore, it has been shown that the process stability and layer homogeneousness are very good and that charges and arcs are rare.

In the operation of the coating apparatus according to the fifth embodiment, particularly adhesive layers can be achieved by prior etching with metal ions. The layer quality is also very good. Furthermore, a highly homogeneous layer thickness is achieved in concave geometries. However, compared to the other examples, the layering rate is somewhat reduced. The electric supply of the HPPMS magnetrons is configured as in the previous examples.

Figure 1:
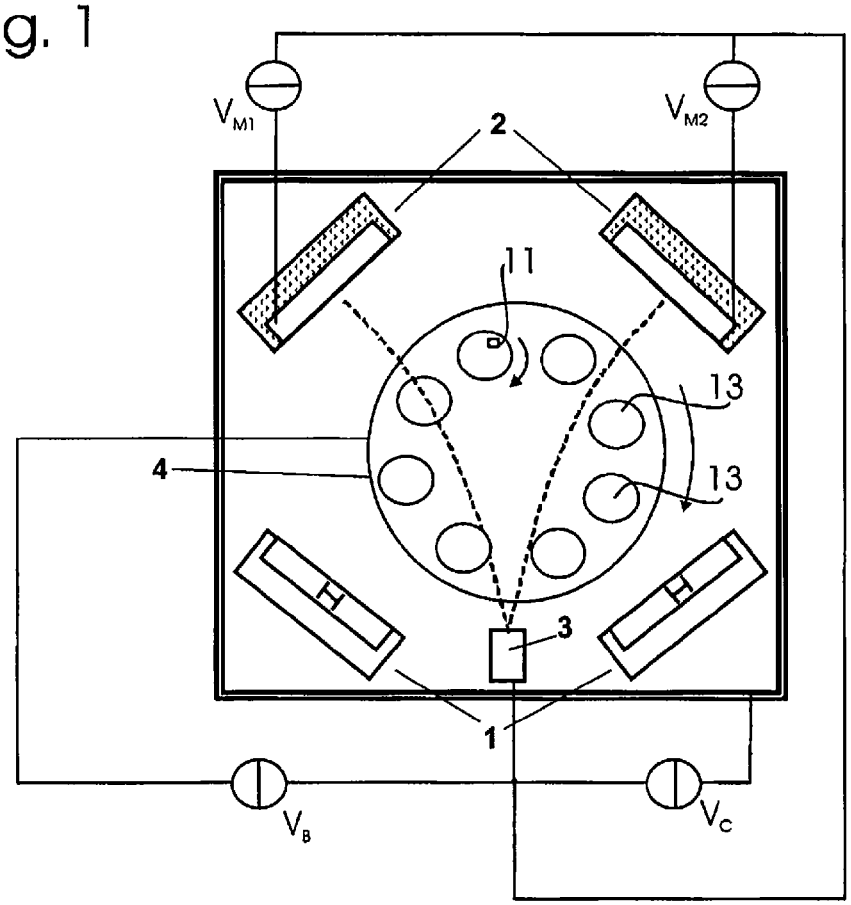
Figure 2:
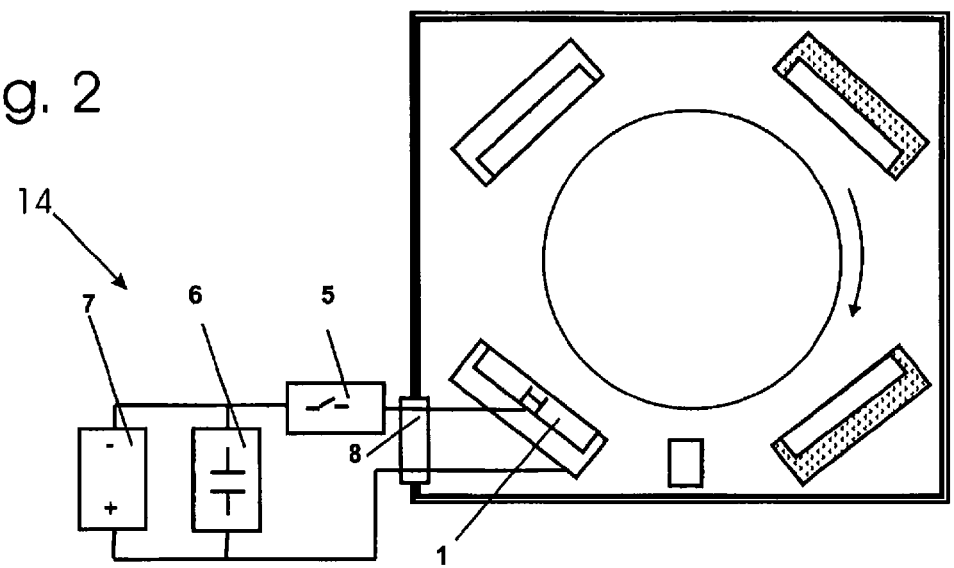
Figure 3:
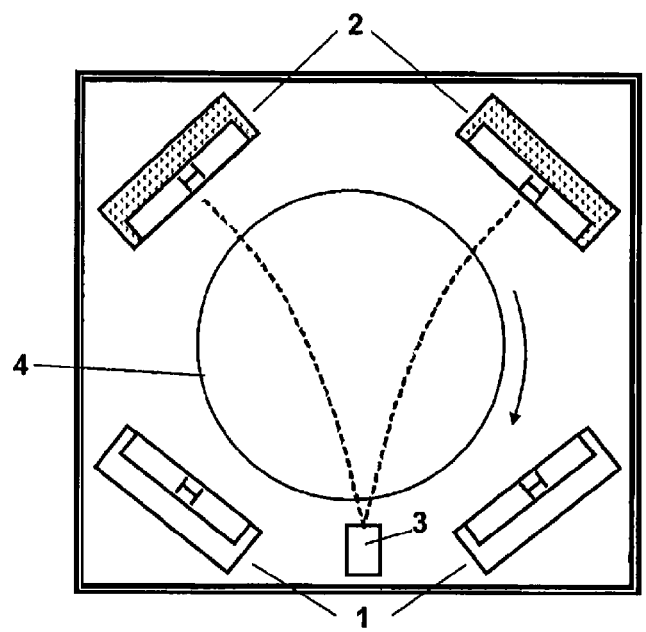
Figure 4:
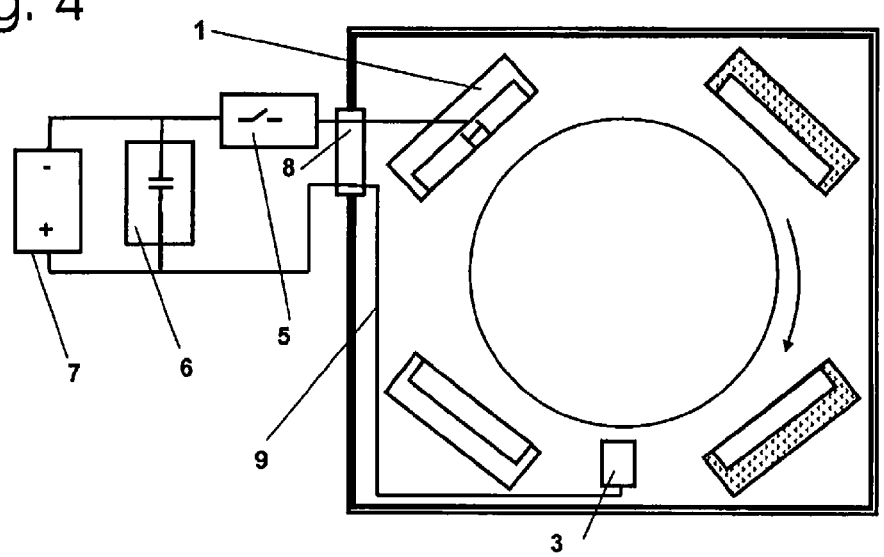
Figure 5:
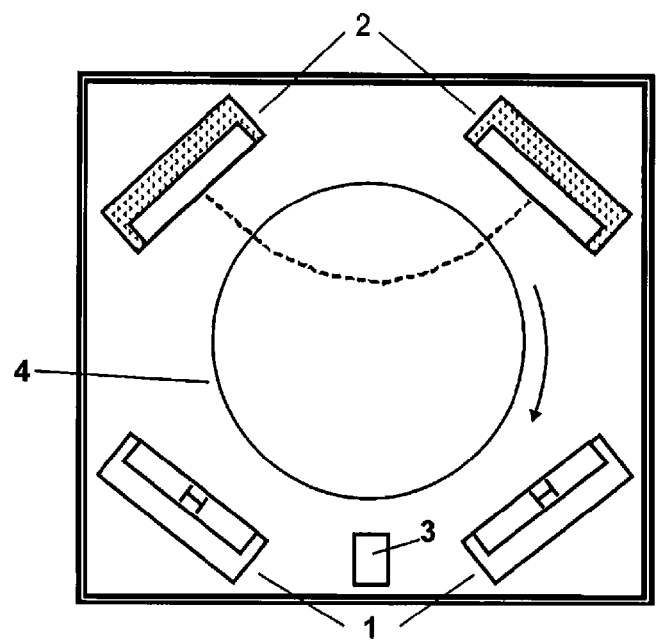
Figure 6:
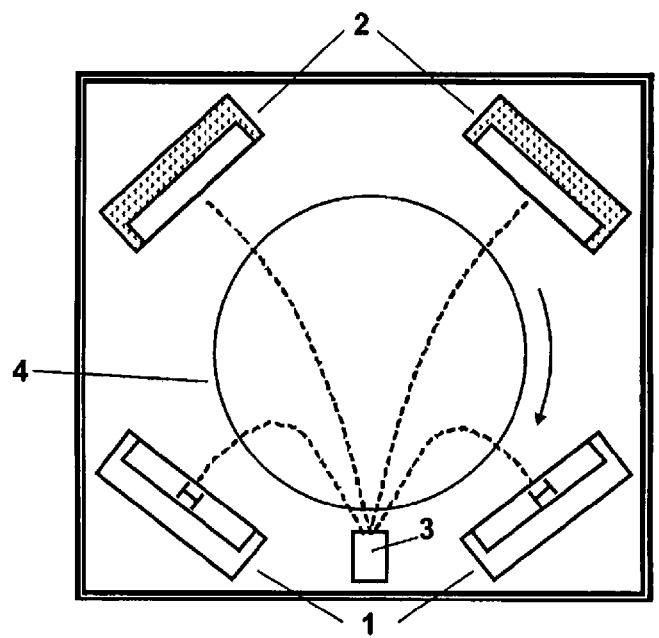
FIG. 6 shows a fourth embodiment of a coating apparatus. In the fourth embodiment, which is, again, otherwise identical to the above-mentioned embodiments, the coating apparatus contains two HPPMS magnetrons and two conventional magnetrons, wherein all magnetrons are connected against a common anode to achieve high densities of metal and gas ions in the entire coating volume.
Figure 7:
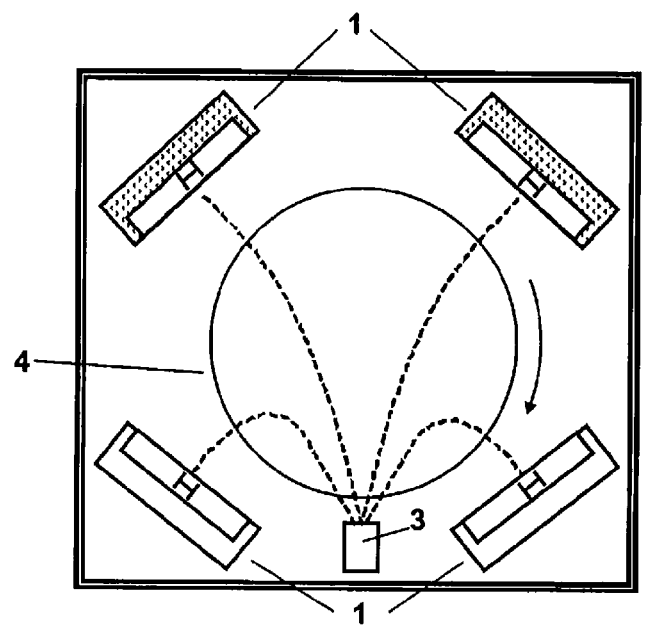
FIG. 7 shows a fifth embodiment of a coating apparatus. In the fifth embodiment, which, again, is otherwise identical to the above-mentioned embodiments, the coating apparatus contains four HPPMS magnetrons, which are all connected against a common anode to achieve high densities of metal ions in the entire coating volume.
Figure 8:
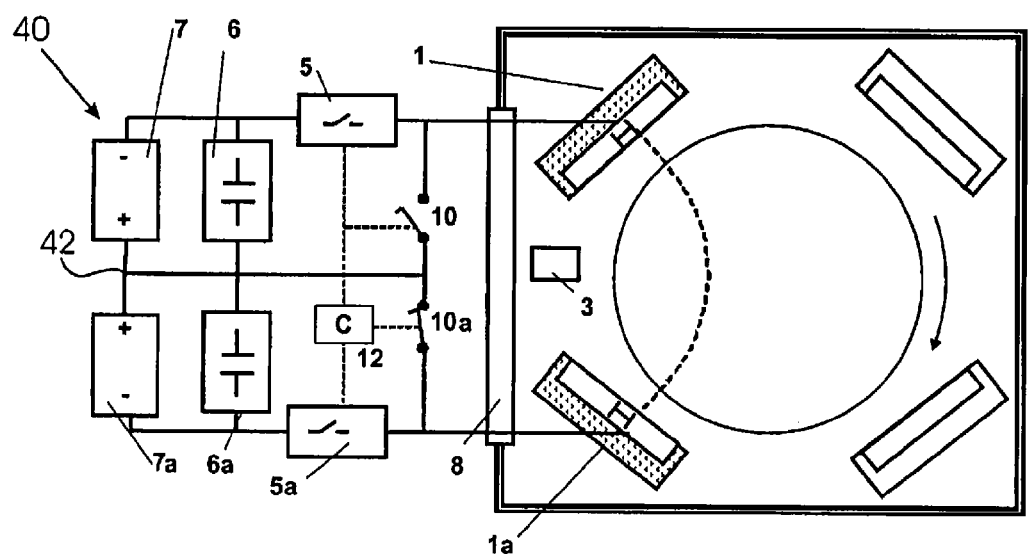
Figure 9:
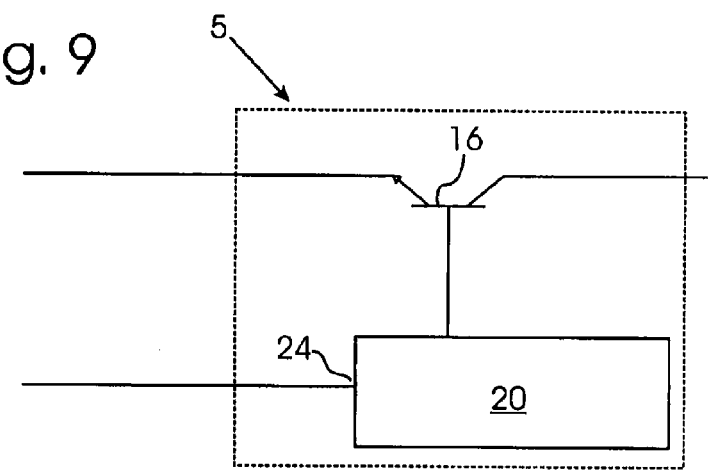
Figure 10:
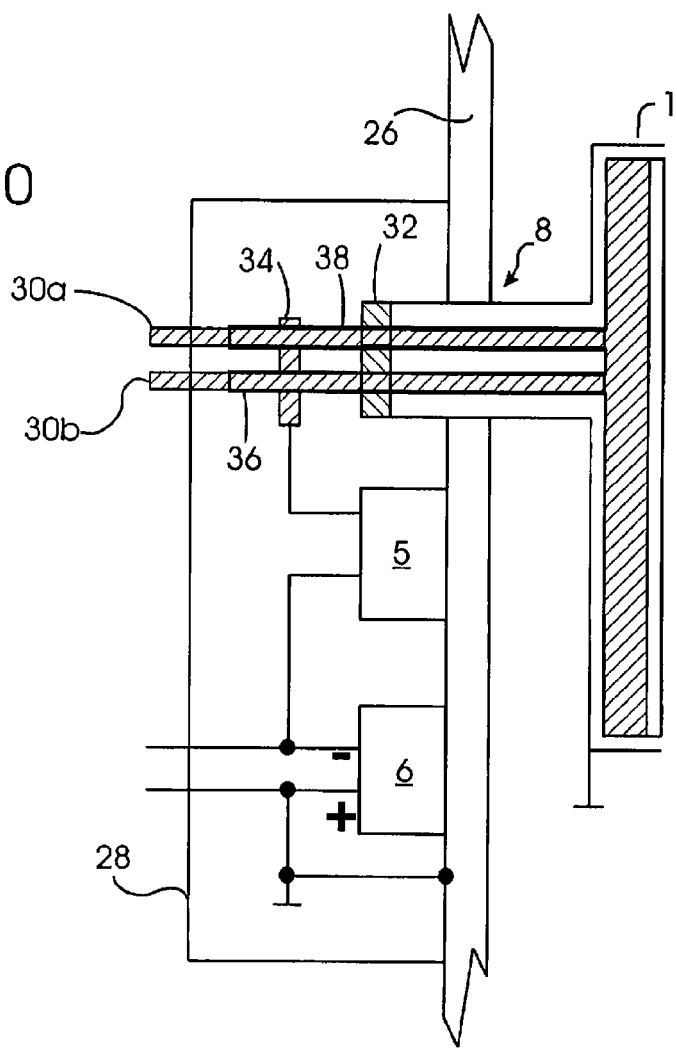

In a further, sixth embodiment of a coating apparatus shown in FIG. 8, which is otherwise identical to the above-mentioned embodiments, two HPPMS magnetrons are pulsed against each other in the bipolar mode.

In the sixth embodiment, the two HPPMS magnetrons are connected to a common HPPMS power supply 40. The power supply 40 comprises two DC power supply units 7, 7a, which are symmetrically connected to a central tap 42. Parallel to the DC power supply units 7, 7a, capacitive elements 6, 6a are connected, which are preferably both configured as capacitor banks, as explained with reference to the first embodiment. Each negative pole of each capacitive element 6, 6a is electrically connected to the target of each magnetron 1, 1a via a series connected switching element 5, 5a.

Each of the two symmetric parts of the HPPMS power supply 40 can be shorted by means of two additional switches 10, 10a controlled by a control unit 12. The switches 10, 10a, in the bipolar pulse operation of magnetrons 1, 1a, wherein each of the targets alternates between being an anode and a cathode, connect each target which, in the next pulse, is to be the anode, to the positive pole of the associated HPPMS power supply. The other switch remains open. Thus, for each pulse, one of the two HPPMS magnetrons acts as an anode and the other one as an associated cathode.

The requirements for the switches 10, 10a are modest, since they are switched in the pulse pauses and not while current is flowing. A control unit 12 provides for the synchronization of the switching elements 5, 5a, 10, 10a. Again, the switching elements are commonly mounted on the chamber back wall and are connected to the HPPMS magnetrons by electric leads that extend into the chamber through a common vacuum passage 8. As far as possible, the electric leads then extend in the interior of the chamber, preferably with reference to the overall length, which conducts the HPPMS pulses, for the most part in the interior of the chamber.

In an alternative embodiment (not shown) a charging apparatus is provided that is configured in such a manner that it charges both capacitor banks 6, 6a in the pulse pause.

With the arrangement according to the example shown in FIG. 8, there are fewer charges during operation and the layers become smooth. The two other magnetrons can also be HPPMS magnetrons and be operated in the same way. It is also possible to operate them against the earth or against a common counter electrode 3. Alternatively, the two other magnetrons can also be conventional magnetrons. They can be operated, for example, in the dual magnetron mode or also against the earth and a common electrode.

The invention claimed is:

1. An apparatus for pretreating and coating of bodies by magnetron sputtering, comprising:
a vacuum chamber with a metallic chamber wall and at least one magnetron arranged therein having at least one sputter target,
wherein said magnetron is provided as a high power pulsed magnetron sputtering (HPPMS) magnetron for operation according to the high power pulsed magnetron sputtering process,
wherein at least one electrical conductor feeds electric pulses to the HPPMS magnetron by connecting a capacitor bank of parallel connected capacitors to the sputter target of the HPPMS magnetron by means of a switching element, and
wherein the switching element and the capacitor bank are arranged directly on the chamber wall, and
wherein a direct current power supply is connected to charge the capacitors of the capacitor bank, said direct current power supply being arranged remote from said chamber wall.

2. The apparatus according to claim 1, wherein
a vacuum passage for the electric supply of the HPPMS magnetron is provided on the chamber wall,
wherein the capacitor bank, the switching element and the vacuum passage form a unit.

3. The apparatus according to claim 1, wherein
a cooling means is provided for the HPPMS magnetron, wherein a cooling medium is passed through tubes to the HPPMS magnetron,
wherein the tubes extend through the chamber wall via a vacuum passage,
and wherein the tubes are utilized as electric conductors, by means of which current is conducted from the switching element to the HPPMS magnetron.

4. The apparatus according to claim 1, further comprising:
a cooling means is provided for cooling the switching element.

5. The apparatus according to claim 1, wherein
at least one electrode pair is provided, at least one electrode of which is an HPPMS magnetron,
wherein electric leads are provided for the electrodes of the electrode pair,
and wherein the electric leads for the two electrodes extend into said vacuum chamber through a common vacuum passage or two adjacent vacuum passages and the electric leads extend to the electrodes in the interior of the vacuum chamber.

6. An apparatus according to claim 1, said apparatus comprising
a substrate table for supporting bodies to be coated,
at least one plasma-generating electrode pair with a first electrode and a second electrode,
wherein said HPPMS magnetron is said first electrode which is operated according to the high power pulsed magnetron sputtering mode, wherein an HPPMS power supply is provided between the first and second electrodes,
and wherein the first and second electrodes are arranged in such a manner that a body supported on the substrate table is arranged between the active surfaces of the electrode pair or is moved through the space between the active surfaces of the electrode pair.

7. The apparatus according to claim 6, wherein
at least one further electrode pair is arranged in the vacuum chamber,
of which at least one of the electrodes is configured as a magnetron, which is connected to a DC power supply or a conventional pulsed power supply.

8. The apparatus according to claim 6, wherein
the distance between the active surfaces of at least one of the electrode pairs is more than 20 cm.

9. The apparatus according to claim 6, wherein
the second electrode is an anode,
and wherein a bias voltage supply is provided between the anode and the substrate table for generating a bias voltage.

10. The apparatus according to claim 9, wherein
the surface of the anode exposed to the plasma during coating is smaller than the surface of the first electrode exposed to the plasma.

11. The apparatus according to claim 9, wherein
an electric power supply is provided between the anode and the chamber wall to keep the anode at a positive potential with respect to the chamber wall during coating.

12. The apparatus according to claim 9, wherein
at least two magnetrons are connected against a common anode during coating.

13. The apparatus according to claim 6, wherein
the second electrode is an HPPMS magnetron, and
an HPPMS power supply is provided between the first and second electrodes, which power supply is disposed to operate the electrodes in a bipolar manner pulsed opposite to each other.

14. A method for pretreating and coating a body by means of magnetron sputtering, comprising:

arranging the body in a vacuum chamber having a metallic chamber wall and at least one magnetron arranged therein having at least one sputter target, providing a capacitor bank connected to the HPPMS magnetron via at least on electrical conductor and a switching element, said switching element and said capacitor bank being arranged on the chamber wall, charging the capacitors of the capacitor bank from a direct current power supply, said direct current power supply being arranged remote from said chamber wall, generating a plasma in the vacuum chamber, wherein said at least one sputter target is sputtered by operating said magnetron as a high power pulsed magnetron according to the high power pulsed magnetron sputtering process by feeding electric pulses to the sputter target from said capacitor bank by operating said switching element.

* * * * *